United States Patent
Lee et al.

(10) Patent No.: US 9,431,343 B1
(45) Date of Patent: Aug. 30, 2016

(54) STACKED DAMASCENE STRUCTURES FOR MICROELECTRONIC DEVICES

(71) Applicants: Ki-Don Lee, Austin, TX (US); Jinseok Kim, Bucheon-si (KR)

(72) Inventors: Ki-Don Lee, Austin, TX (US); Jinseok Kim, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/691,336

(22) Filed: Apr. 20, 2015

Related U.S. Application Data

(60) Provisional application No. 62/131,523, filed on Mar. 11, 2015.

(51) Int. Cl.
| | |
|---|---|
| H01L 23/52 | (2006.01) |
| H01L 23/528 | (2006.01) |
| H01L 23/522 | (2006.01) |
| H01L 23/532 | (2006.01) |
| H01L 23/58 | (2006.01) |

(52) U.S. Cl.
CPC ....... *H01L 23/5283* (2013.01); *H01L 23/5226* (2013.01); *H01L 23/53238* (2013.01); *H01L 23/58* (2013.01)

(58) Field of Classification Search
CPC .............. H01L 23/5283; H01L 23/5226; H01L 23/53238; H01L 23/58
See application file for complete search history.

(56) References Cited

U.S. PATENT DOCUMENTS

| | | | |
|---|---|---|---|
| 6,016,011 A | 1/2000 | Cao et al. | |
| 6,033,939 A | 3/2000 | Agarwala et al. | |
| 6,252,290 B1 | 6/2001 | Quek et al. | |
| 6,445,073 B1 | 9/2002 | Zhao | |
| 6,475,810 B1 | 11/2002 | Zhou et al. | |
| 6,731,007 B1 * | 5/2004 | Saito | H01L 21/76838 257/762 |
| 6,984,580 B2 | 1/2006 | Dostalik et al. | |
| 7,157,370 B2 | 1/2007 | Inoue et al. | |
| 7,230,336 B2 | 6/2007 | Adams et al. | |
| 7,696,092 B2 | 4/2010 | Lopatin et al. | |
| 7,944,055 B2 | 5/2011 | Allen et al. | |
| 8,853,095 B1 | 10/2014 | Kelly et al. | |
| 2002/0177287 A1 * | 11/2002 | Downey | H01L 23/5223 438/396 |
| 2002/0185736 A1 * | 12/2002 | Tanaka | H01L 21/76838 257/750 |
| 2004/0245643 A1 * | 12/2004 | Takewaki | H01L 21/76802 257/758 |
| 2006/0097397 A1 | 5/2006 | Russell | |
| 2008/0079167 A1 * | 4/2008 | Yang | H01L 23/5228 257/763 |
| 2009/0160019 A1 * | 6/2009 | Yang | H01L 23/5223 257/532 |
| 2009/0283911 A1 * | 11/2009 | Tsai | H01L 21/76835 257/758 |
| 2010/0164116 A1 * | 7/2010 | Li | H01L 23/5226 257/774 |
| 2011/0312177 A1 | 12/2011 | Lin et al. | |

(Continued)

OTHER PUBLICATIONS

Lee et al., "Statistical Study for Electromigration Reliability in Dual-Damascene Cu Interconnects", *IEEE Transactions on Device and Materials Reliability*, vol. 4, No. 2, No. 2004, pp. 237-245.

(Continued)

*Primary Examiner* — Mamadou Diallo
(74) *Attorney, Agent, or Firm* — Myers Bigel & Sibley, P.A.

(57) ABSTRACT

A microelectronic device includes a dual-damascene interconnect structure and a single-damascene line structure directly on the dual-damascene interconnect structure. The dual-damascene interconnect structure and the single-damascene line structure may each include multiple line segments that are arranged in a brick wall pattern. The brick wall pattern may also be used with two or more single-damascene line structures. Various microelectronic devices and related fabrication methods are described.

19 Claims, 23 Drawing Sheets

(56) References Cited

U.S. PATENT DOCUMENTS

| | | |
|---|---|---|
| 2013/0207272 A1 | 8/2013 | Lin |
| 2013/0292817 A1* | 11/2013 | Lacroix .................. H01L 22/34 257/737 |
| 2013/0313717 A1* | 11/2013 | Holmes ............. H01L 21/76811 257/774 |
| 2013/0328198 A1 | 12/2013 | Chou et al. |
| 2014/0001638 A1* | 1/2014 | Fu ........................ H01L 21/768 257/773 |
| 2014/0291819 A1* | 10/2014 | Barth ................. H01L 23/53276 257/659 |
| 2014/0322909 A1 | 10/2014 | Chen et al. |
| 2014/0342549 A1 | 11/2014 | Holmes et al. |
| 2016/0020176 A1* | 1/2016 | Yang ................. H01L 23/53228 257/759 |

OTHER PUBLICATIONS

ITRS, "International Technology Roadmap for Semiconductors—Interconnect", 2011 Edition, 94 pp.

\* cited by examiner

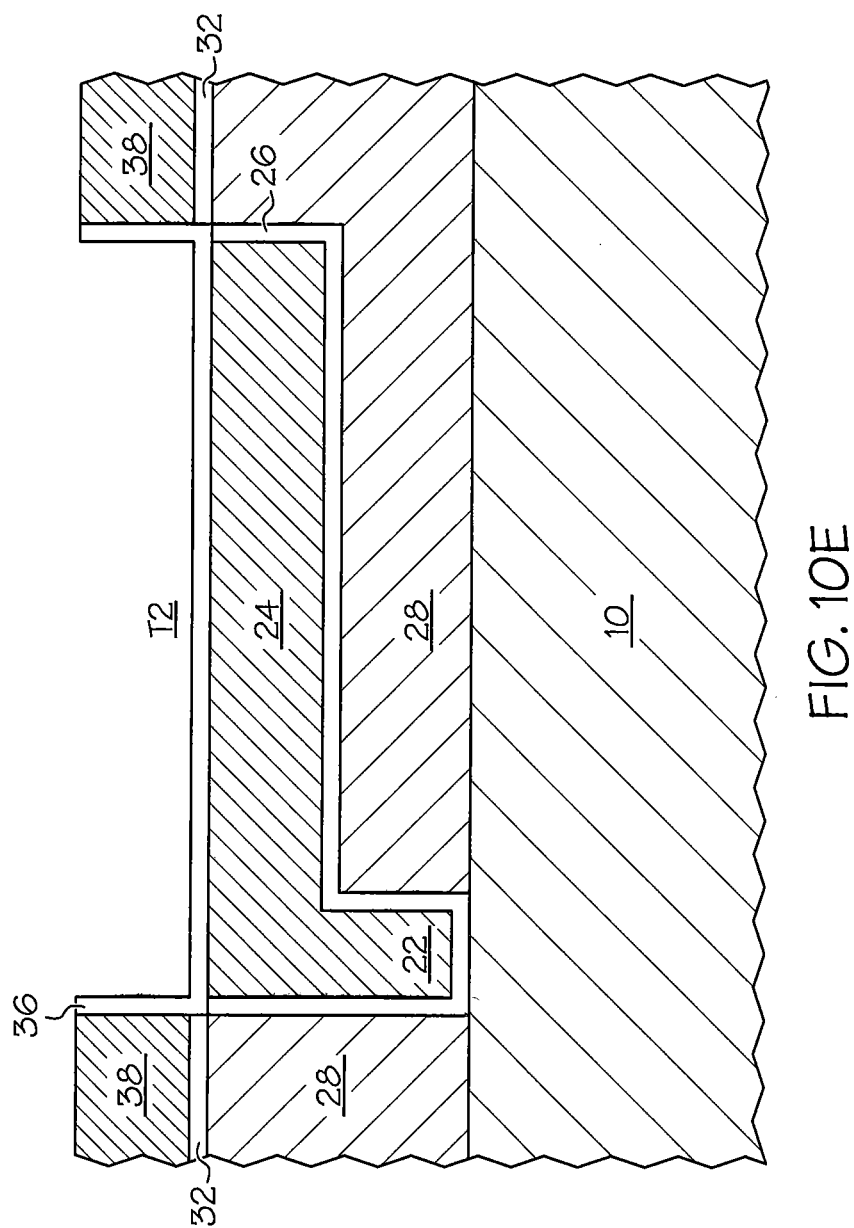

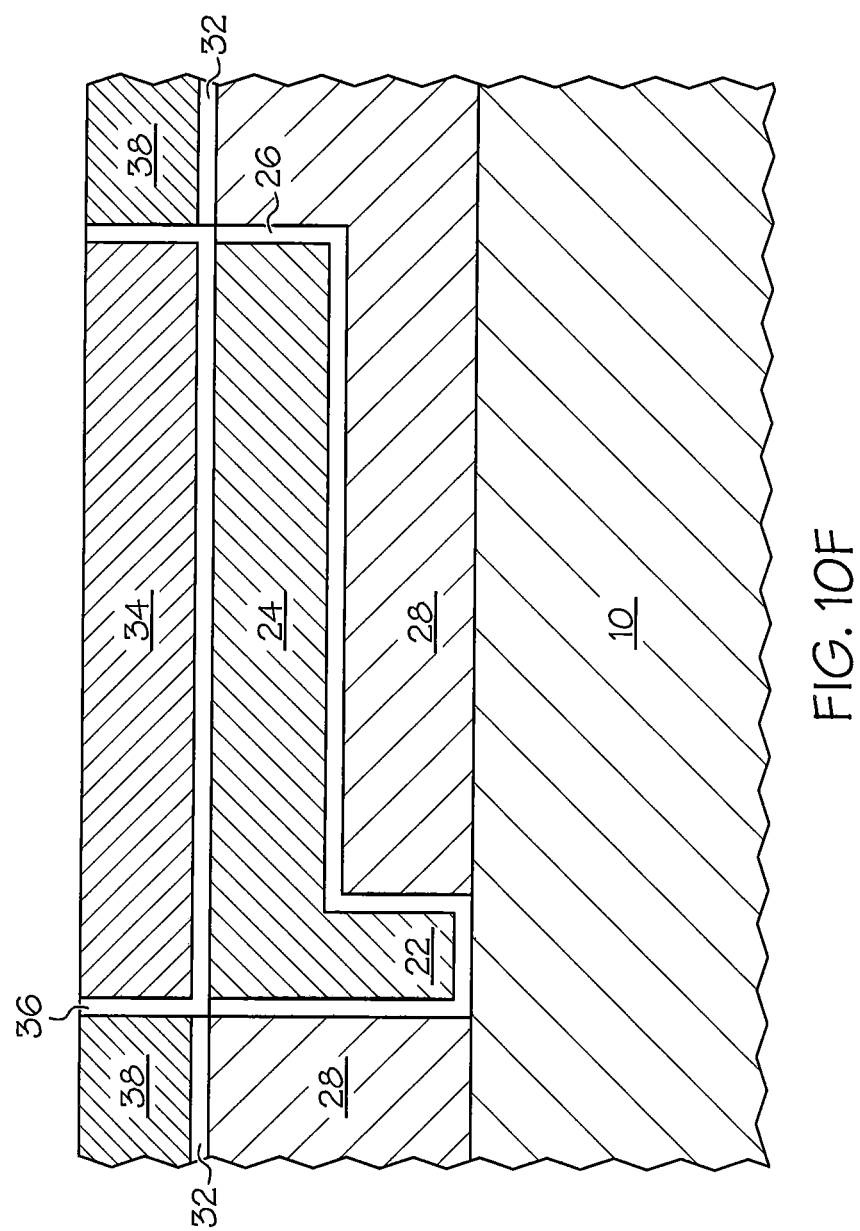

STACKED DAMASCENE STRUCTURES FOR MICROELECTRONIC DEVICES

CLAIM OF PRIORITY

This application claims the benefit of U.S. Provisional Application No. 62/131,523, filed Mar. 11, 2015, entitled Brick Pattern of Stacked Layers to Maximize Short Length EM and Yield, the disclosure of which is hereby incorporated herein by reference in its entirety as if set forth fully herein.

FIELD

The present inventive concepts generally relate to microelectronic devices and, more particularly, to wiring structures for microelectronic devices.

BACKGROUND

Microelectronic devices, such as integrated circuit devices, are widely used in consumer, commercial and other applications. A microelectronic device generally includes a substrate, such as a semiconductor substrate, that includes therein/thereon a large number of active devices, such as transistors, and passive devices, such as resistors and capacitors. A wiring structure on the substrate is used to selectively electrically connect the active and/or passive devices to form circuits.

As the integration density of microelectronic devices continues to increase, and the performance of microelectronic devices continues to increase, the active and passive devices and the wiring structure may continue to scale down. Such scaling down may increase the number of interconnections in the wiring structure, which may produce more defects and/or decrease the production yield of the microelectronic device. Scaling down of the wiring structure may also increase the resistance thereof, which can decrease performance. Scaling down of the wiring structure may also increase the aspect ratios thereof, which may increase the difficulty of the fabrication process and thereby reduce the yield and/or reliability of the microelectronic devices. Finally, scaling down of the wiring structure may produce a smaller cross-section thereof, and increased performance requirements may cause the wiring structure to operate at higher frequencies, which may increase electromigration issues.

Wiring structures of microelectronic devices often are fabricated using a damascene process in which an underlying insulating layer is patterned with open trenches and/or vias where a conductor will be formed. A thick metal layer (e.g., copper) that significantly overfills the trenches and vias is deposited on the insulating layer, and Chemical-Mechanical Planarization (CMP) is used to remove the metal that extends above the top of the insulating layer. Metal sunken within the insulating layer is not removed, and becomes the patterned conductor. Single-damascene processes generally form and fill a single feature, such as a trench or via, with metal. Dual-damascene processes generally form and fill two features with metal at once. For example, a via and a trench overlying the via may both be filled with a single metal deposition using dual damascene.

SUMMARY

Various embodiments described herein may provide microelectronic devices that comprise a damascene structure and a single-damascene line structure directly on the damascene structure. In some embodiments, the damascene structure comprises a dual-damascene interconnect structure or a single-damascene line structure. In some embodiments, the damascene structure and the single-damascene line structure each comprise a plurality of line segments that are arranged in a brick wall pattern. The brick wall pattern may also be used with two or more single-damascene line structures.

More specifically, a microelectronic device according to various embodiments described herein may comprise a microelectronic substrate, a dual-damascene interconnect structure on the microelectronic substrate and a single-damascene line structure directly on the dual-damascene interconnect structure. The dual-damascene interconnect structure may comprise a conductive via and a first conductive line directly on the conductive via opposite the microelectronic substrate. The single-damascene line structure may comprise a second conductive line on the first conductive line opposite the conductive structure.

In some embodiments, the dual-damascene interconnect structure further comprises a first barrier layer that extends on a bottom surface of the conductive via, on a sidewall of the conductive via, on a bottom surface of the first conductive line outside the conductive via and on a sidewall of the first conductive line. Moreover, the single-damascene line structure may further comprise a second barrier layer that extends between a top surface of the first conductive line and a bottom surface of the second conductive line and on a sidewall of the second conductive line. In some embodiments, the first barrier layer does not extend between the conductive via and the first conductive line.

In other embodiments, the dual-damascene interconnect structure further comprises a first intermetal dielectric layer on the microelectronic substrate, wherein the first conductive line and the conductive via extend into the first intermetal dielectric layer. Moreover, the single-damascene structure may further comprise a second intermetal dielectric layer on the first intermetal dielectric layer opposite the substrate, wherein the second conductive line extends into the second intermetal dielectric layer, and a capping layer between the first and second intermetal dielectric layers.

In yet other embodiments, the dual-damascene interconnect structure further comprises a first intermetal dielectric layer on the microelectronic substrate, wherein the first conductive line, the conductive via and the first barrier layer extend into the first intermetal dielectric layer. Moreover, the single-damascene line structure further comprises a second intermetal dielectric layer on the first intermetal dielectric layer opposite the substrate, wherein the second conductive line extends into the second intermetal dielectric layer, and a capping layer between the first and second intermetal dielectric layers, the capping layer being coplanar with a portion of the second barrier layer that extends between the top surface of the first conductive line and the bottom surface of the second conductive line and electrically connecting the first and second conductive lines.

In some embodiments, a top surface of the first conductive line is congruent to a bottom surface of the second conductive line.

Moreover, in some embodiments, the first conductive line segments, the second conductive line segments and the first and second gaps are arranged in a brick wall pattern so as not to fail by electromigration effects.

In some embodiments, the first conductive line comprises a plurality of first conductive line segments including at least one first gap therebetween. The second conductive line comprises a plurality of second conductive line segments including at least one second gap therebetween. Moreover, the at least one first gap is laterally offset from the at least one second gap. In some embodiments, each of the first and second conductive line segments is sufficiently short so as to not fail by electromigration effects.

Moreover, in some embodiments, the dual-damascene interconnect structure further comprises a first barrier layer that extends on a bottom surface of the conductive via, on a sidewall of the conductive via, on bottom surfaces of the first conductive line segments outside the conductive via and on sidewalls of the first conductive line segments. Moreover, the single-damascene line structure further comprises a second barrier layer that extends between top surfaces of the first conductive line segments and bottom surfaces of the second conductive line segments and on sidewalls of the second conductive line segments.

In some embodiments the single-damascene line structure is a first single-damascene line structure and the microelectronic device further comprises a second single-damascene line structure directly on the first single-damascene line structure opposite the dual-damascene interconnect structure, the second single-damascene line structure comprising a third conductive line on the second conductive line opposite the first conductive line.

A microelectronic device according to yet other embodiments described herein comprises a microelectronic substrate, a first conductive line on the microelectronic substrate and a second conductive line directly on the first conductive line opposite the microelectronic substrate. The first conductive line comprises a plurality of first conductive line segments including at least one first gap therebetween. The second conductive line comprises a plurality of second conductive line segments, including at least one second gap therebetween. The at least one first gap is laterally offset from the at least one second gap.

In some embodiments, the first and second conductive lines are damascene conductive lines.

In some embodiments, each of the first and second conductive line segments is sufficiently short so as not to fail by electromigration effects.

Moreover, in some embodiments, the first conductive line comprises a first barrier layer that extends on bottom surfaces of the first conductive line segments and on sidewalls of the first conductive line segments. The second conductive line comprises a second barrier layer that extends on bottom surfaces of the second conductive line segments and on sidewalls of the second conductive line segments.

Some embodiments further comprise a first intermetal dielectric layer on the microelectronic substrate, a second intermetal dielectric layer on the first intermetal dielectric opposite the substrate and a capping layer between the first and second intermetal dielectric layers. The first conductive line segments extend into the first intermetal dielectric layer and the second conductive line segments extend into the second intermetal dielectric layer.

Other embodiments further comprise a first intermetal dielectric layer on the microelectronic substrate, wherein the first conductive line segments extend into the first intermetal dielectric layer. A second intermetal dielectric layer is provided on the first intermetal dielectric layer opposite the substrate, wherein the second conductive line segments extend into the second intermetal dielectric layer. A capping layer is provided between the first and second intermetal dielectric layers, the capping layer being coplanar with the second barrier layer that extends on bottom surfaces of the second conductive line segments and electrically connecting the first and second conductive lines.

Methods of fabricating a microelectronic device are also provided according to various embodiments described herein. These methods comprise etching a via and a first trench that are connected to one another, in a first dielectric layer on a microelectronic substrate; lining a bottom surface and a sidewall of the via and a bottom surface and a sidewall of the first trench with a first barrier layer; forming a unitary metal via and first line on the first barrier layer that lines the bottom surface and sidewall of the via and the bottom surface and sidewall of the first trench; etching a second trench in a second dielectric layer that is on the first dielectric layer, the second trench exposing at least a portion of a top surface of the first line; lining the at least a portion of the top surface of the first line and a sidewall of the second trench with a second barrier layer; and forming a second line on the second barrier layer that lines the at least a portion of the top surface of the first line and the sidewall of the second trench.

The various other microelectronic devices described above may also be fabricated using analogous fabrication methods.

Other methods and devices according to various embodiments described herein will be or become apparent to one with skill in the art upon review of the following drawings and detailed description. It is intended that all such additional methods and devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

FIGS. 10A-10F are cross-sectional views illustrating methods of fabricating microelectronic devices and devices so fabricated according to various embodiments described herein.

DETAILED DESCRIPTION

Various embodiments described herein can provide microelectronic devices that include a dual-damascene interconnect structure and a single-damascene line structure directly on the dual-damascene interconnect structure. By stacking a single-damascene line structure directly on a dual-damascene interconnect structure, the line redundancy can be increased, to thereby allow improved yields, notwithstanding scaling down of the wiring structures. Moreover, lower resistance may be provided that can at least partially offset the increased resistance that may be caused by scaling down. Lower aspect ratios may also be used, to thereby allow increased yield and reliability of devices, notwithstanding scaling down.

Moreover, in some embodiments, the dual-damascene interconnect structure and the single-damascene line structure may each comprise a plurality of line segments that are arranged in a brick wall pattern. This can provide improved electromigration performance, by providing short-length interconnects, and can also reduce or eliminate the need for metal capping, copper alloying and/or microstructure control in order to reduce weaker electromigration performance and higher electromigration demand that is produced by scaling down. The electromigration challenges in scaling down of wiring are described, for example, in the International Technology Roadmap for Semiconductors (ITRS) 2011 Edition Interconnect at Page 20.

Figure 1:
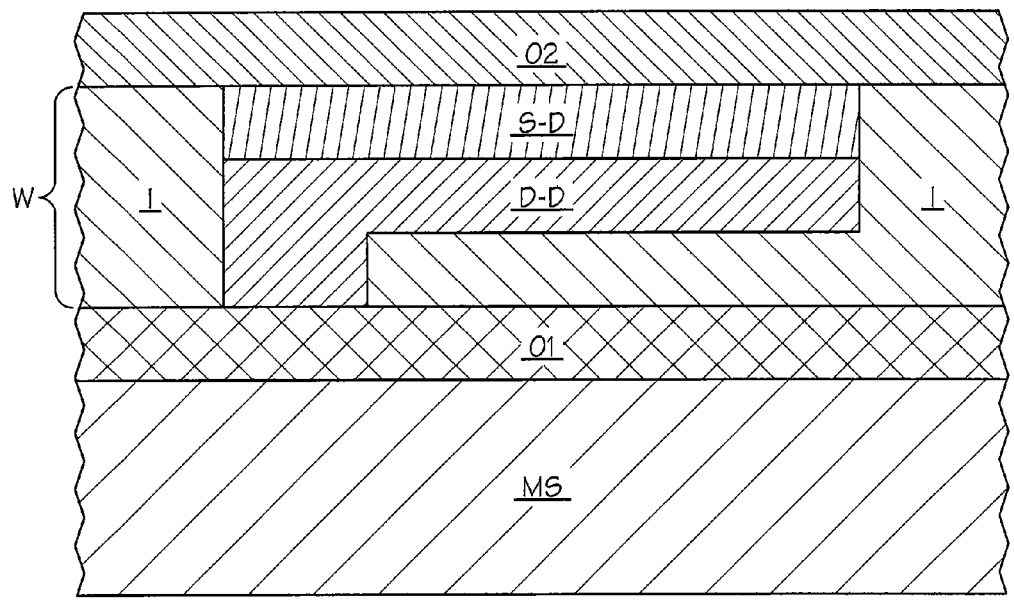
FIG. 1 is a schematic cross-sectional diagram illustrating a microelectronic device according to various embodiments described herein.

FIG. 1 is a schematic cross-sectional diagram illustrating a microelectronic device according to various embodiments described herein. Referring now to FIG. 1, the microelectronic device includes a microelectronic substrate MS which may comprise a bulk, single element and/or compound semiconductor substrate and/or a single element and/or compound semiconductor layer or layers on a semiconductor or non-semiconductor substrate. Various other first conductive, insulating and/or semiconductor layers 01 may be provided on the microelectronic substrate MS. The microelectronic substrate MS and/or the first other layers 01 can include active and/or passive microelectronic devices therein and/or thereon.

A wiring structure W is provided on the microelectronic substrate MS, either directly or on the first other layers 01. The wiring structure W includes a dual-damascene interconnect structure D-D, and a single-damascene line structure S-D directly on the dual-damascene interconnect structure D-D. Both the dual-damascene interconnect structure D-D and the single-damascene line structure S-D are embedded in one or more insulating layers I. Both the single-damascene S-D and dual-damascene D-D structures provide unitary metal structures which may comprise copper. Additional layers, such as barrier layers, may be provided in these structures, as will be described below. Various other second conductive, insulating and/or semiconductor layers 02 may also be provided on the wiring structure W.

Figure 2A:
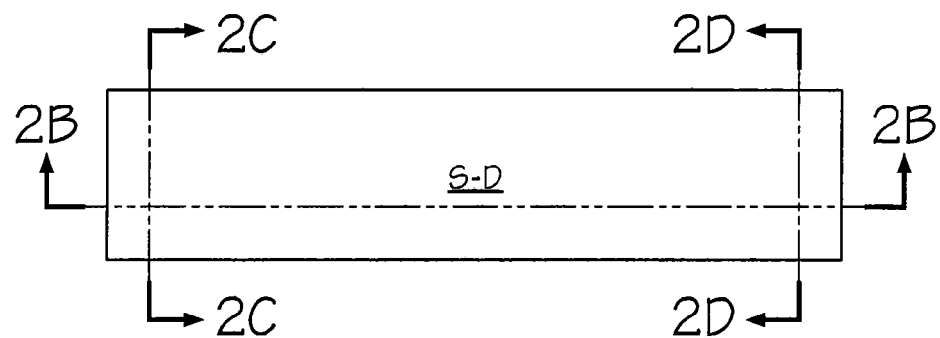
FIGS. 2A-2D are a top view, a cross-sectional view along the line 2B of FIG. 2A, a cross-sectional view along line 2C of FIG. 2A, and a cross-sectional view along the line 2D of FIG. 2A, respectively, of a stacked damascene structure according to various embodiments described herein.
Figure 2B:
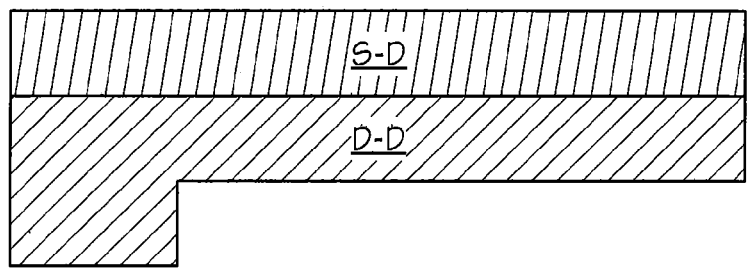
Figure 2C:
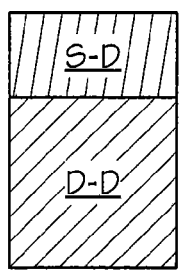
Figure 2D:
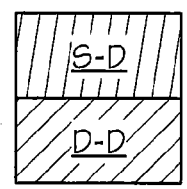
Figure 3A:
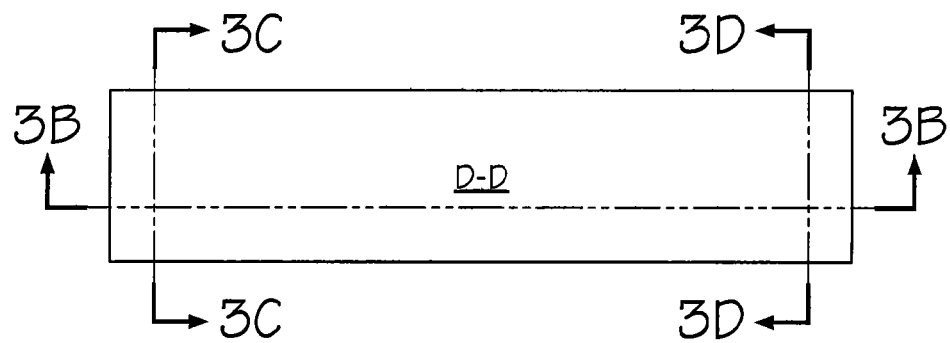
FIGS. 3A-3D are a top view, a cross-sectional view along the line 3B of FIG. 3A, a cross-sectional view along the line 3C of FIG. 3A, and a cross-sectional view along the line 3D of FIG. 3A, respectively, of a conventional dual-damascene structure that does not have a single-damascene structure stacked thereon.
Figure 3B:
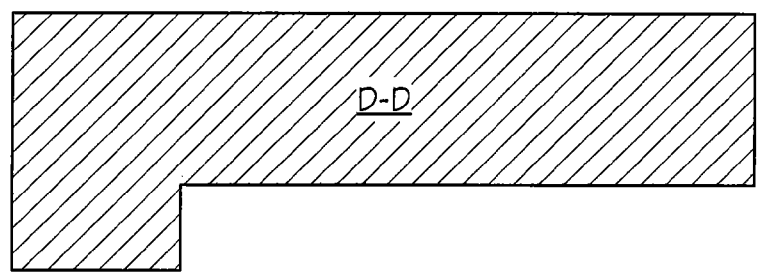

FIG. 2A is a top view, FIG. 2B is a cross-sectional view along the line 2B of FIG. 2A, FIG. 2C is a cross-sectional view along line 2C of FIG. 2A, and FIG. 2D is a cross-sectional view along the line 2D of FIG. 2A, of stacked damascene structures according to various embodiments described herein. Moreover, FIG. 3A is a top view, FIG. 3B is a cross-sectional view along the line 3B, FIG. 3C is a cross-sectional view along the line 3C and FIG. 3D is a cross-sectional view along the line 3D, of a conventional dual-damascene structure that does not have a single-damascene structure stacked thereon.

As will be described in more detail below, the single-damascene structure S-D of FIGS. 2A-2D may be fabricated using the same mask or reticle that was used to fabricate the trench of the dual-damascene structure D-D of FIGS. 2B-2D. Thus, an additional mask or reticle may not be needed. Moreover, comparing FIGS. 2B and 3B, with the stacking of layers for the line structures, the trench metal resistance can be reduced. Moreover, with a larger cross-sectional area, resistance may be decreased, but capacitance may be up, resulting in the same level of resistive-capacitive (RC) delay in the line structures.

Figure 3C:
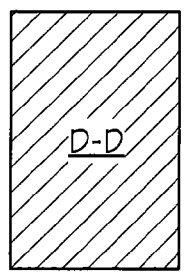
Figure 3D:
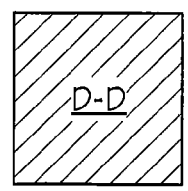

Also, comparing FIGS. 2C and 2D with FIGS. 3C and 3D, with stacking of line structures, as the resistance decreases, a high aspect ratio for the trench process is not needed. Rather, as can be seen in FIGS. 2C and 2D, relatively low aspect ratios may be used compared to FIGS. 3C and 3D because multiple lower aspect ratio layers are used to build up a structure with a high aspect ratio. Thus, various embodiments described herein can improve yield and reliability.

As to defects, the stacking of layers in FIGS. 2A-2D can provide a defect redundancy compared to the single layer of FIGS. 3A-3D, which can reduce the sensitivity to defects, and can improve yields and reliability. Finally, with stacking, a single-damascene structure S-D is added on top of the dual-damascene structure D-D, which can provide a metal capping layer between the single-damascene structure S-D and the dual-damascene structure D-D, as will described in detail below. This can improve electromigration performance. As such, a potentially expensive and unreliable electro-less metal capping process that may be needed in future designs may not be needed. Accordingly, stacked damascene structures of FIGS. 1-2D can provide many potential advantages relative to a conventional dual-damascene structure of FIGS. 3A-3D.

Figure 4:
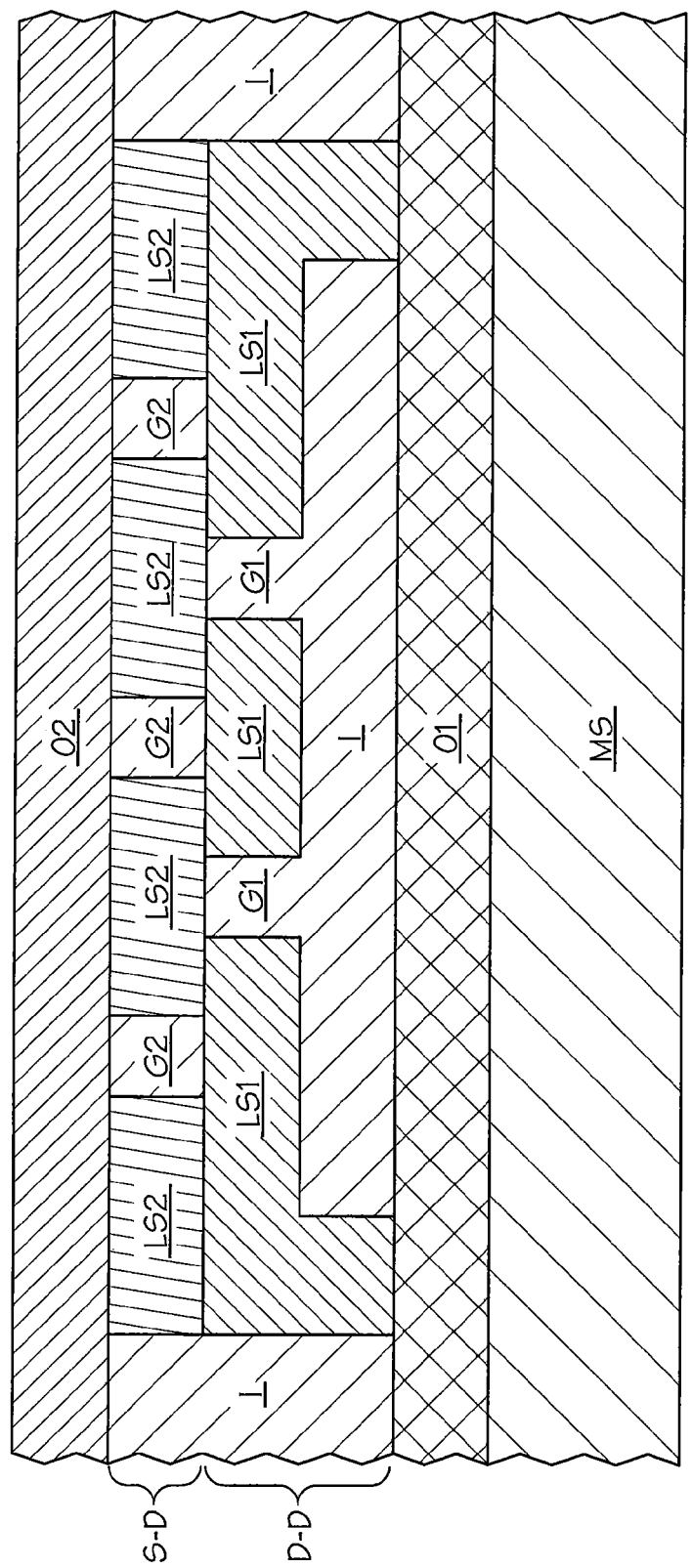
FIG. 4 is a schematic cross-sectional view of microelectronic devices according to yet other embodiments described herein.

FIG. 4 is a schematic cross-sectional view of microelectronic devices according to yet other embodiments described herein. Comparing FIG. 1 to FIG. 4, the conductive line of the dual-damascene D-D structure is divided into a plurality of conductive line segments LS1 including at least one first gap G1 therebetween. The single-damascene structure S-D is also divided into a plurality of second conductive line segments LS2 including at least one second gap G2 therebetween. As shown in FIG. 4, comparing the D-D and S-D structures, the number of line segments need not be the same, nor need their lengths nor gap widths be the same. However, as shown in FIG. 4, the at least one first gap G1 is laterally offset from the at least one second gap G2. This provides a "brick wall" pattern of stacked line segments.

It will also be understood that in FIGS. 1, 2A-2D and 4, the dual-damascene structure D-D can be a dual-damascene structure without vias in some embodiments. In other embodiments, the dual-damascene structure D-D may be replaced by a single-damascene structure as well.

Configurations of FIG. 4 can provide improved electromigration (EM) performance. As is known, electromigration is a process by which a metal conductor changes shape under the influence of an electric current flowing through it, and eventually leads to the breaking of the conductor. The brick wall structure of FIG. 4 can improve the electromigration resistance of the wiring structure as will be described in detail in connection with FIGS. 5A-5D.

Figure 5A:
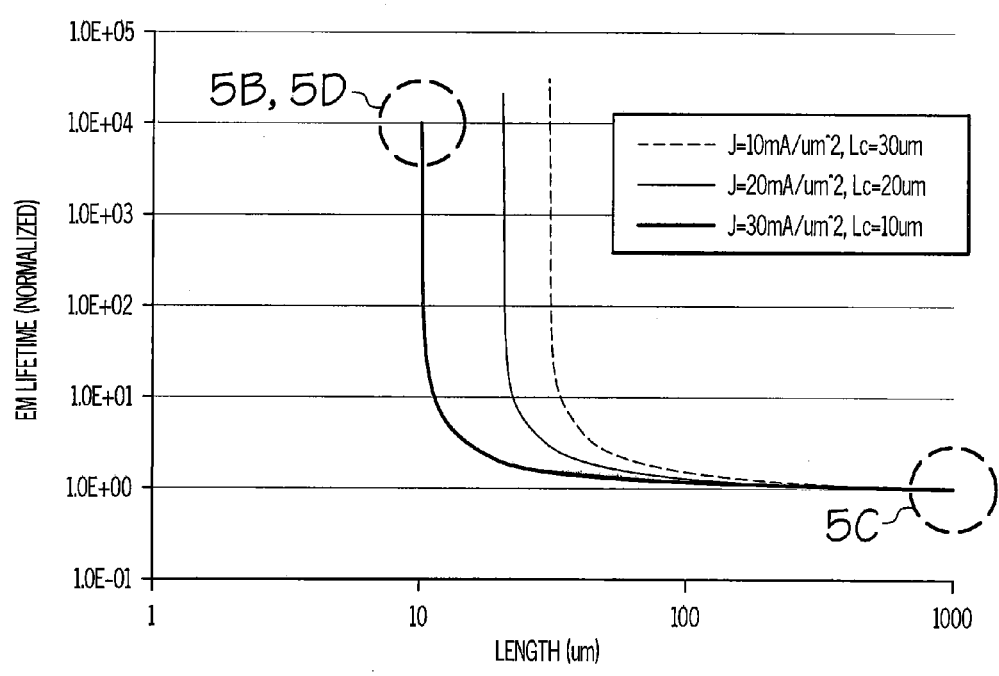
FIG. 5A graphically illustrates normalized electromigration lifetime vs. line length in microns for various current densities.
Figure 5B:
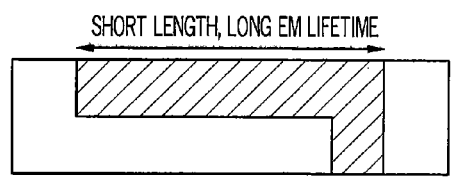
FIG. 5B is a schematic cross-sectional view of a short line length dual-damascene line that corresponds to the dashed circle 5B of FIG. 5A.
Figure 5C:
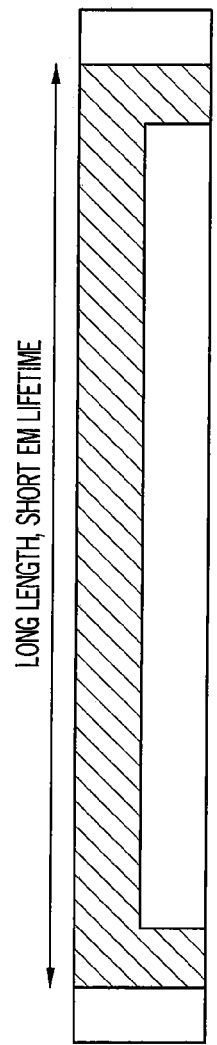
FIG. 5C is a schematic cross-sectional view of a long line length dual-damascene line that corresponds to the dashed circle 5C of FIG. 5A.

Specifically, FIG. 5A graphically illustrates normalized EM lifetime vs. line length in microns for various current densities. FIG. 5A is based on standard Blech EM equations. As illustrated in FIG. 5B, short length dual-damascene lines, for example having lengths of about 10 µm or less, can have long EM lifetimes. Thus, according to various embodiments described herein, the first and second conductive lines of FIGS. 1-2D may be sufficiently short so as not to fail by electromigration effects. In contrast, as illustrated in FIG. 5C, long length lines, for example about 100 µm or more, can have short EM lifetimes. However, as illustrated in FIG. 5D, short length line segments using stacked damascene structures according to various embodiments described herein, can provide a long line length, while providing short length line segments for a long electromigration lifetime.

Figure 5D:
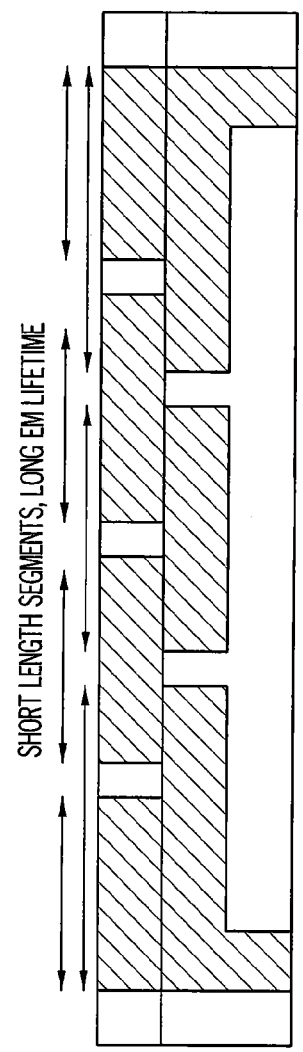
FIG. 5D is a schematic cross-sectional view of a long line that comprises short length line segments according to various embodiments described herein that corresponds to the dashed circle 5D of FIG. 5A.

Thus, in FIG. 5D, the first damascene layer and the second damascene layer can be broken into multiple short line segments, each having a length which may, in some embodiments, be less than about 5 µm, and the break points or gaps may be staggered, resulting in a brick wall pattern, also referred to as a "brick pattern". The current flows from one short line segment to another short line segment in another layer. It is known that EM improves significantly with shorter line length, which can allow a 200% to 500% higher current density limit for circuit designs. This is the well known short length EM effect. With the brick pattern of FIG. 4 and FIG. 5D, a long line (stacked) can be broken into multiple short line chain structures, without intermediate vias therebetween. This can increase the current density design limit by about 200% to about 500% at Direct Current (DC).

If various embodiments described herein are not used, designers can replace a long line with serially linked dual-damascene (line and via) interconnects for short length EM benefits. But this may require a massive redesign of the microelectronic device and will also increase the number of vias which can provide weak points for reliability and yield, in a given high current path. In contrast, the brick pattern of FIGS. 4 and 5D can be applied to one or two selected levels to fix EM violations that are found in the design checker, without the need to massively revise the entire layout. This can save a lot of design time.

Moreover, if a brick pattern is not used, designers may need to widen the interconnects to avoid EM violations. Unfortunately, however, increasing a line width may also result in a massive multi-level layout revision. Finally, it is possible to adjust the RC parameters of the line by changing a ratio of metal and gaps. For example, in some embodiments, the smaller the gap, the higher the reliability of the device and the lower the resistance of the brick wall pattern stacked line.

Even more specifically, the EM short line effect states that the shorter the line length, the longer the EM lifetime. Thus, below a critical length (Lc), the line will not fail by EM over the expected life of the microelectronic device. Stated differently, below the critical length, the line will not fail by electromigration effects. The critical length Lc is inversely proportional to the current density J. Thus, assume the product of J and Lc is about 3000 A/cm, which is a generally accepted industry standard. The Lc is about 30 µm for J=10 mA/µm$^2$, 15 µm for J=20 mA/µm$^2$ and 10 µm for J=30 mA/µm$^2$. For example, if the current density is 30 mA/µm$^2$, EM lifetime follows the leftmost line in the graph of FIG. 5A. A short length line of FIG. 5B may have a length that is close to Lc, and may be less than about 30 µm long in some embodiments, less than about 15 µm long in some embodiments, less than about 10 µm long in some embodiments, and less than about 5 µm long in other embodiments. In contrast, a long line, such as illustrated in FIG. 5C, may have a length of between about 100 µm and 1,000 µm, and may have a short EM lifetime. Thus, by breaking the long line of FIG. 5C into, for example, 10 µm components in a brick pattern, as shown in FIG. 5D, the EM lifetime may be 10,000 times longer. For practical purposes, each of the first and second conductive line segments is sufficiently short so as not to fail by electromigration effects.

Figure 6:
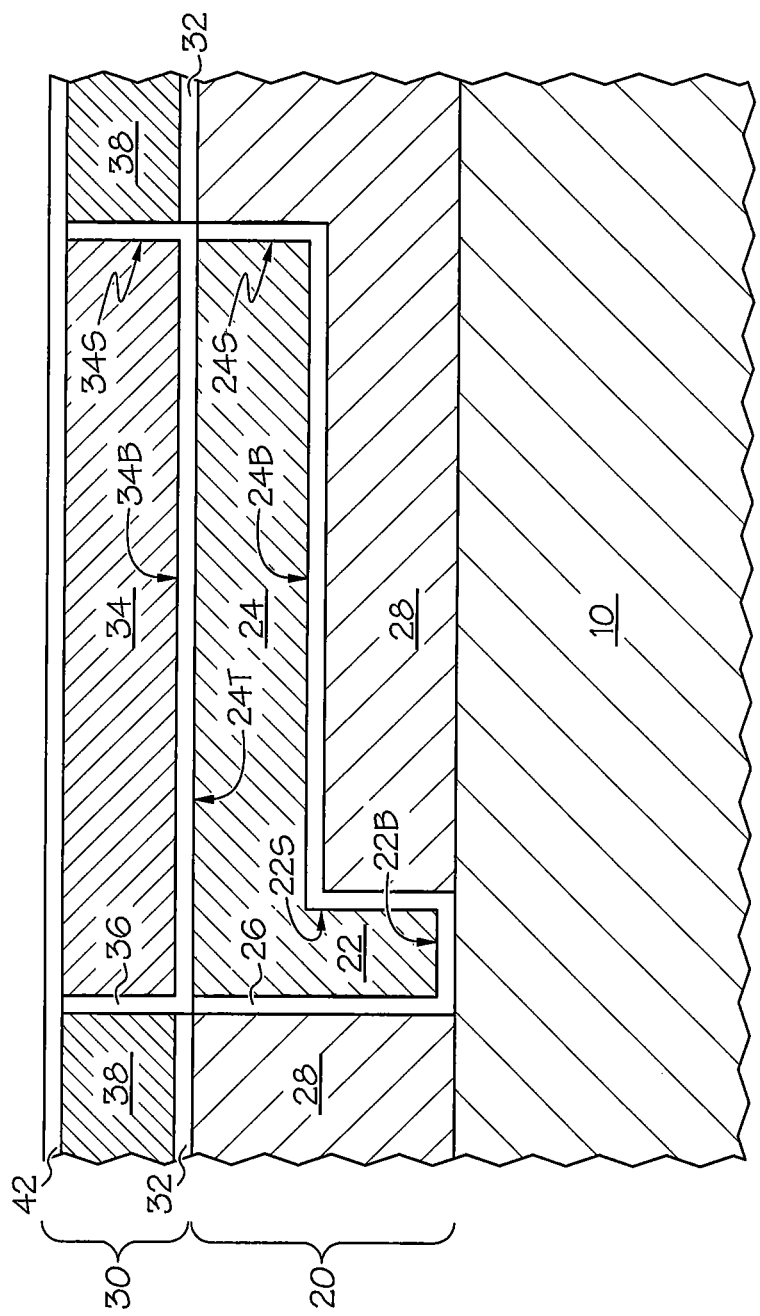
FIG. 6 is a cross-sectional view illustrating a microelectronic device including stacked damascene structures according to various embodiments described herein.

FIG. 6 is a cross-sectional view illustrating a microelectronic device including stacked damascene structures according to various embodiments described herein. FIG. 6 may be regarded as a more detailed embodiment of FIG. 1. Referring now to FIG. 6, the microelectronic device comprises a microelectronic substrate 10 which may be any of the microelectronic substrates MS that were described in connection with FIG. 1. For simplicity, any intervening layers (corresponding to element 01 in FIG. 1) are not illustrated. A dual-damascene interconnect structure 20 is provided on the microelectronic substrate 10. The dual-damascene interconnect structure 20 may provide a more detailed embodiment of the dual-damascene structure D-D of FIG. 1. The dual-damascene interconnect structure 20 comprises a conductive via 22 and a first conductive line 24 directly on the conductive via 22 opposite the microelectronic substrate 10. The conductive via 22 may have a height of between several tens of nanometers and several microns in some embodiments, and may be circular; elliptical, ellipsoidal or polygonal in cross-section. The first conductive line 24 may be between several tens of nanometers and several microns in thickness in some embodiments. The conductive via 22 and first conductive line 24 provide a unitary metal structure comprising, for example, copper. A single-damascene line structure 30 is also provided directly on the dual-damascene interconnect structure 20. The single-damascene line structure 30 may provide a more detailed embodiment of the single-damascene structure S-D of FIG. 1. The single-damascene line structure 30 comprises a second conductive line 34 on the first conductive line 24 opposite the conductive via 22. The second conductive line 34 may be between several tens of nanometers and several microns thick in some embodiments and may also comprise copper.

Still referring to FIG. 6, in other embodiments, the dual-damascene interconnect structure 20 further comprises a first barrier layer 26 that extends on a bottom surface 22B of the conductive via 22, on a sidewall 22S of the conductive via 22, on a bottom surface 24B of the first conductive line 24 outside the conductive via 22 and on a sidewall 24S of the first conductive line 24. The single-damascene line structure 30 further comprises a second barrier layer 36 that extends between a top surface 24T of the first conductive line 24 and a bottom surface 34B of the second conductive line 34, and on a sidewall 34S of the second conductive line 34. It will be understood that the conductive via 22, first conductive line 24 and second conductive line 34 may include one or more sidewalls depending upon the shape thereof. For example, a circular, elliptical or ellipsoidal structure may have a single sidewall, whereas a polygonal structure may have three or more sidewalls.

Accordingly, in embodiments of FIG. 6, the conductive via 22 and the first conductive line 24 may be encapsulated by the first and second barrier layers 26 and 36, respectively. The barrier layers 26 and 36 may comprise tantalum and/or other conventional materials that act as a barrier to diffusion of copper into surrounding materials. The thickness of the barrier layers 26 and 36 may be between a few Angstroms and several tens of nanometers in some embodiments. Multi-layer barrier layers may also be provided.

It should also be noticed that in FIG. 6 the first barrier layer 26 does not extend between the conductive via 22 and the first conductive line 24. Stated differently, the conductive via 22 and the first conductive line 24 form a unitary structure comprising, for example, copper.

Still referring to FIG. 6, the dual-damascene interconnect structure 20 may further comprise a first intermetal dielectric layer 28 on the microelectronic substrate 10, such that the first conductive line 24 and the conductive via 22 extend into, and in some embodiments completely through, the first intermetal dielectric layer 28. The first intermetal dielectric layer may comprise silicon dioxide and/or other insulating materials, including multiple sublayers. Moreover, the single-damascene line structure 30 may further comprise a second intermetal dielectric layer 38 on the first intermetal dielectric layer 28 opposite the substrate 10. The second conductive line 34 extends into the second intermetal dielectric layer 38 and in some embodiments completely through the second intermetal dielectric layer 38. The second intermetal dielectric layer 38 may comprise silicon dioxide and/or other dielectric materials, including multiple sublayers. A capping layer 32 is provided between the first and second intermetal dielectric layers 28 and 38, respectively. The capping layer 32 may comprise silicon nitride and/or other insulating materials that are different from the first and second intermetal dielectric layers 28 and 38. Multiple sublayers also may be used.

In some embodiments, the capping layer 32 is a first capping layer, and a second capping layer 42 may be provided on the second intermetal dielectric layer 38 and on the second conductive line 34 opposite the substrate 10. The first and second intermetal dielectric layers 28 and 38, respectively, may be between several tens of nanometers and several microns thick in some embodiments. The first and second capping layers 32 and 42 may be between a few Angstroms and several tens of nanometers thick in some embodiments.

Still referring to FIG. 6, the capping layer 32 may be coplanar with a portion of the second barrier layer 36 that extends between the top surface 24T of the first conductive line 24 and the bottom surface 34B of the second conductive line 34 and electrically connecting the first and second conductive lines 24 and 34.

Moreover, in some embodiments, the top surface 24T of the first conductive line 24 is congruent to (i.e., same size and shape as) the bottom surface 34B of the second conductive line 34. Thus, in fabrication, the same reticle or mask may be used to fabricate a trench in the first intermetal dielectric layer 28 and in the second intermetal dielectric layer 38 for the first conductive line 24 and the second conductive line 34, respectively.

Figure 7:
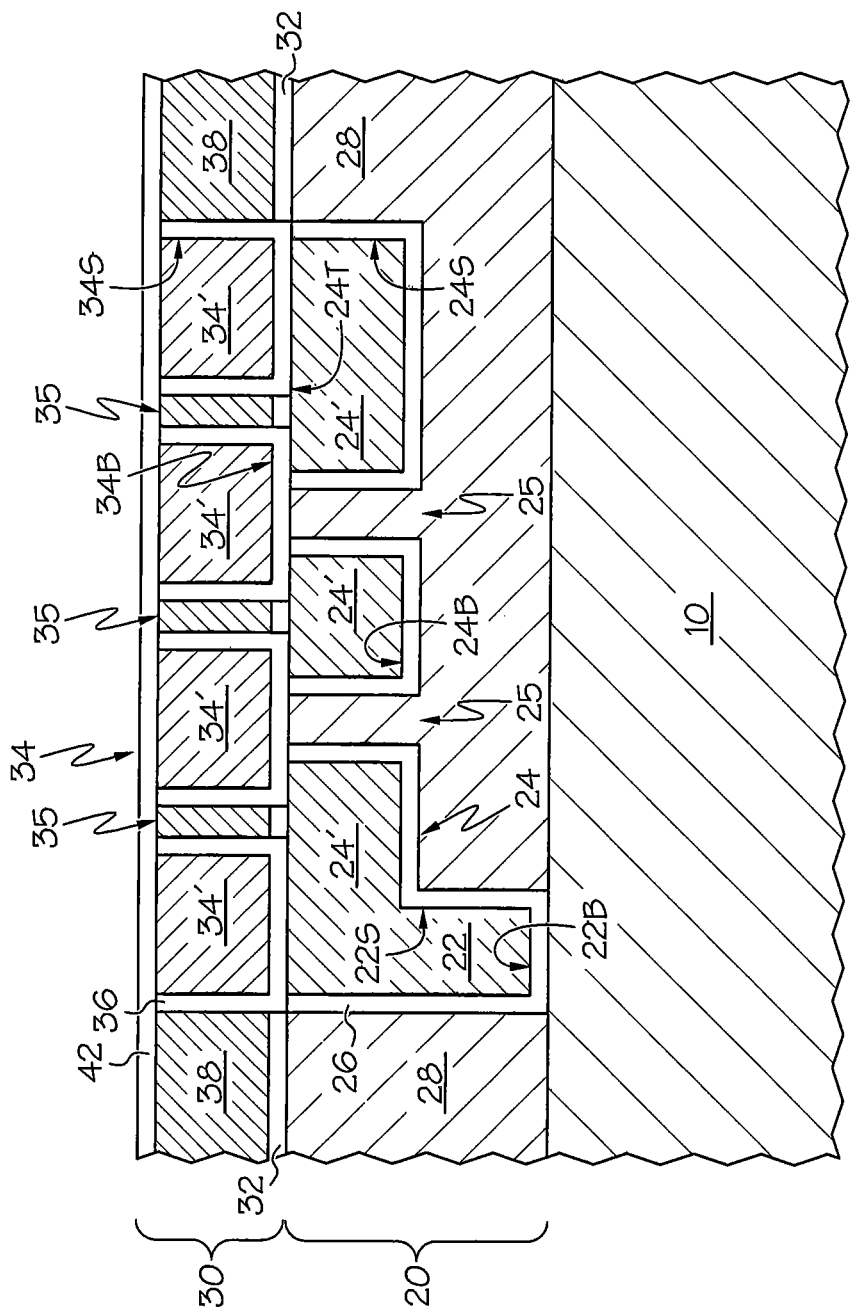
FIG. 7 is a cross-sectional view illustrating a microelectronic device including stacked damascene line segment structures according to various embodiments described herein.

FIG. 7 is a cross-sectional view of other embodiments described herein that may correspond to more detailed embodiments of FIG. 4. In FIG. 7, the first conductive line 24 comprises a plurality of first conductive line segments 24' including at least one first gap 25 therebetween. The first gap(s) 25 may be filled by the first intermetal dielectric layer 28 in some embodiments. The second conductive line 34 comprises a plurality of second conductive line segments 34' including at least one second gap 35 therebetween. The second gap(s) 35 may be filled by the second intermetal dielectric layer 38 in some embodiments. The at least one first gap 25 is laterally offset from the at least one second gap 35. In some embodiments, each of the first line segments 24' and second line segments 34' are the same length, and each of the gaps 25 and 35 are the same width. However, in other embodiments, two or more of the first conductive line segments 24' may be of different length, two or more of the first gaps 25 may be of different widths, two or more of the second conductive line segments 34' may be of different lengths and/or two or more of the second gaps 35 may be of different widths, as long as the first and second gaps 25 and 35 are laterally offset from one another, so as to provide a brick wall structure. In some embodiments, each of the first and second conductive line segments 24' and 34' is sufficiently short so as not to fail by electromigration effects. For example, in some embodiments, each of the first and second line segments 24' and 34' may be less than about 10 µm long.

Still referring to FIG. 7, in these embodiments, the first barrier layer 26 also extends on sidewalls of the first conductive line segments 24', and the second barrier layer 36 also extends on sidewalls of the second conductive line segments 34'.

It will also be understood that in FIGS. 6 and 7, the dual-damascene structure 20 can be a dual-damascene structure without vias in some embodiments. In other embodiments, the dual-damascene structure 20 may be replaced by a single-damascene structure as well.

In other embodiments, the brick wall structure of FIG. 7 may be embodied using two conductive lines that are directly on one another. The two conductive lines may comprise two stacked single-damascene lines rather than a single-damascene line stacked on a dual-damascene interconnect, as was illustrated in FIG. 7.

Figure 8:
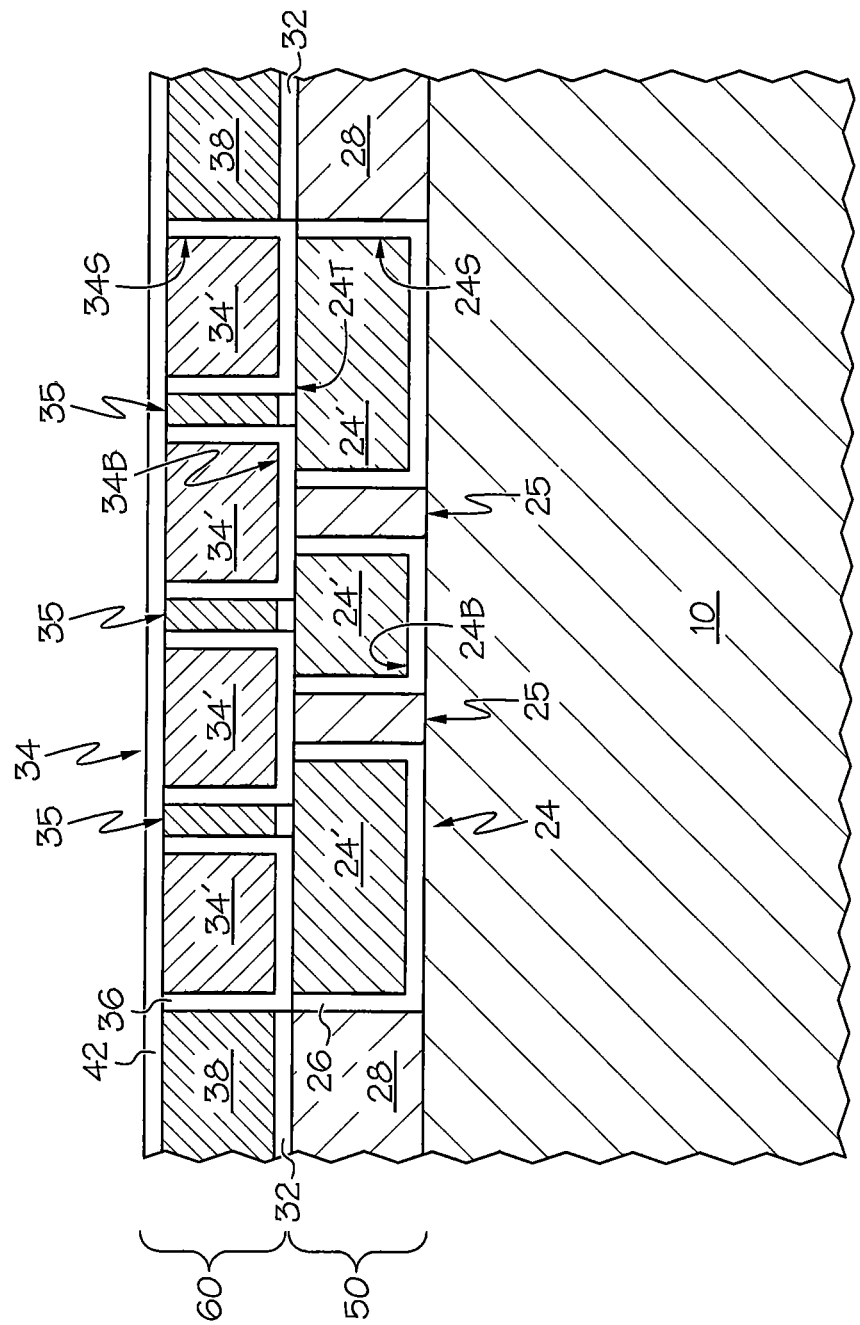
FIG. 8 is a cross-sectional view illustrating a microelectronic device including stacked damascene line segment structures according to yet other embodiments described herein.

Specifically, referring to FIG. 8, other embodiments described herein may include a first conductive line 50 on a microelectronic substrate 10. The first conductive line 50 comprises a plurality of first conductive line segments 24' including at least one first gap 25 therebetween. The first gap(s) 25 may be filled by the first intermetal dielectric layer 28 in some embodiments. A second conductive line 60 is provided directly on the first conductive line 50 opposite the microelectronic substrate 10. The second conductive line 60 comprises a plurality of second conductive line segments 34' including at least one second gap 35 therebetween. The second gap(s) 35 may be filled by the second intermetal dielectric layer 38 in some embodiments. The at least one first gap 25 is laterally offset from the at least one second gap 35. The first and second conductive line segments 50 and 60 may be configured as was described in connection with FIG. 7. A first barrier layer 26 and a second barrier layer 36 also may be provided as was described in connection with FIG.

7. In some embodiments, the first and second conductive lines 50 and 60 are single-damascene conductive lines. First and second intermetal dielectric layers 28 and 38 and a capping layer 32 may also be provided, as was described in connection with FIG. 7.

Figure 9:
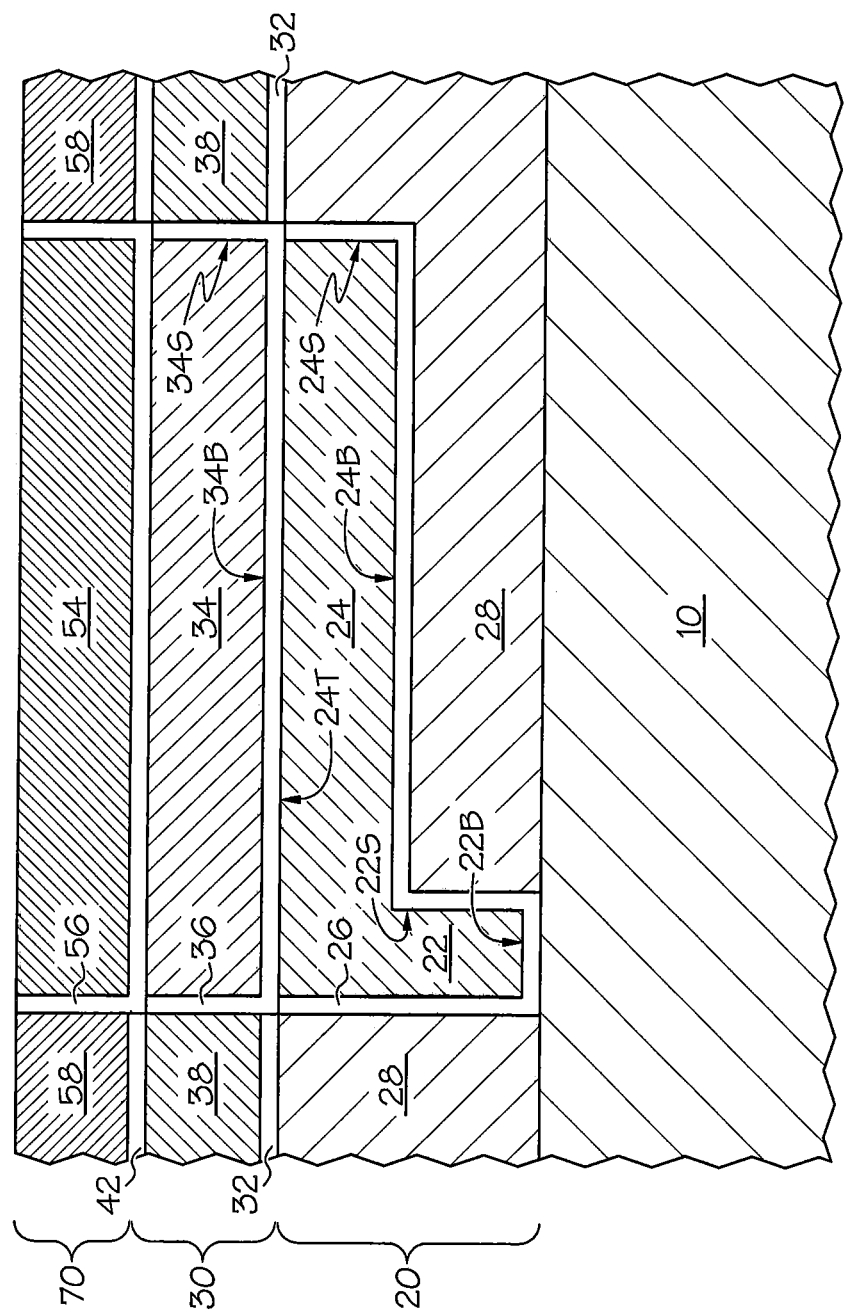
FIG. 9 is a cross-sectional view of a microelectronic device including a second single-damascene line structure on a first single-damascene line structure according to various embodiments described herein.

It will also be understood that in all of the embodiments described in FIGS. 1, 4 and 5-8, a plurality of single-damascene lines may be stacked upon the dual-damascene line or the lowermost single-damascene line, to provide three or more conductive line structures. For example, FIG. 9 illustrates a second single-damascene line structure 70 on a first single-damascene line structure 30. A third conductive line 54, a third intermetal dielectric layer 58 and a third barrier layer 56 are also illustrated.

FIGS. 10A-10F are cross-sectional views illustrating methods of fabricating microelectronic devices according to various embodiments described herein. The methods of FIGS. 10A-10F can be used to fabricate microelectronic devices of, for example, FIG. 6.

Figure 10A:
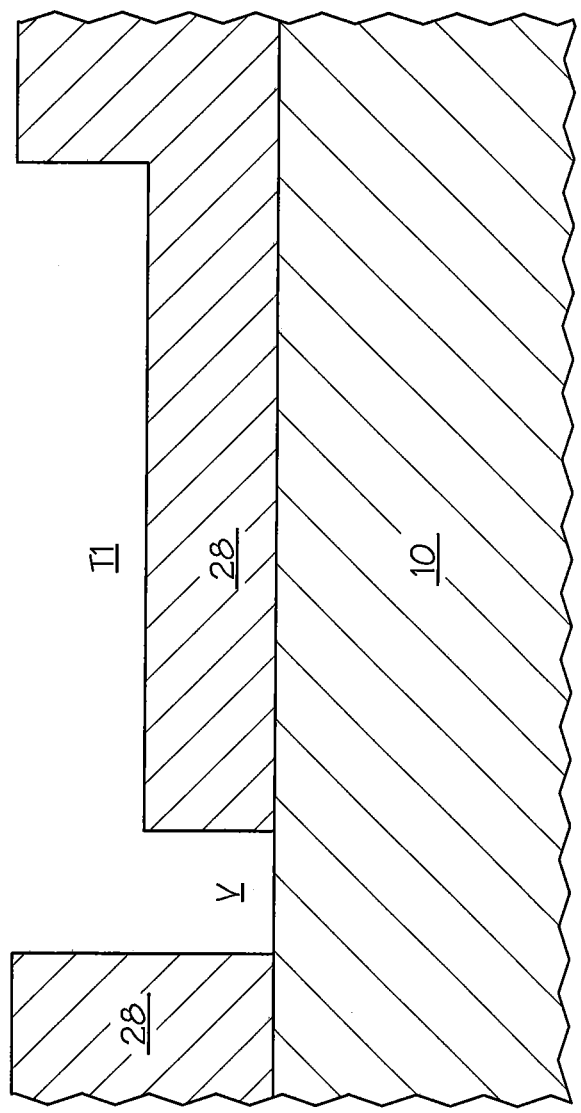

Referring to FIG. 10A, a via V and a first trench T1 that are connected to one another are etched in a first dielectric layer 28 on a microelectronic substrate 10. The via V may be etched prior to the first trench T1 or after the first trench T1 in a "trench first dual-damascene process" or a "via first dual-damascene process". A via-pattern-mask or reticle and a trench-pattern-mask or reticle are used to etch the via V and the first trench T1.

Figure 10B:
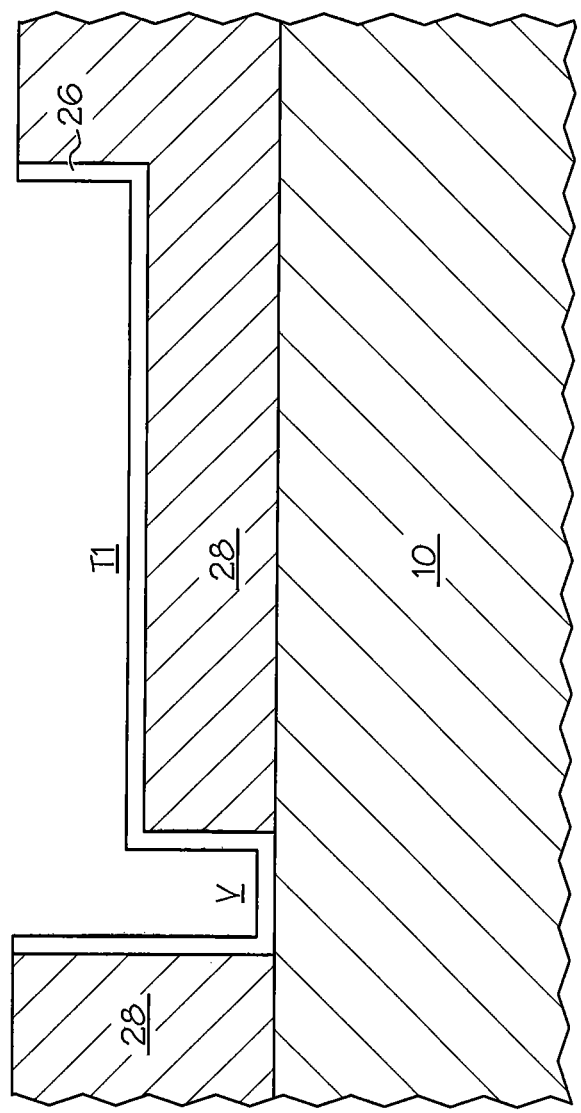

Then, referring to FIG. 10B, a bottom surface and a sidewall of the via V and a bottom surface and a sidewall of the first trench T1 are lined with a first barrier layer 26. The barrier layer may be formed, for example by physical vapor deposition of tantalum. Multi-layer barriers 26 may also be used.

Figure 10C:
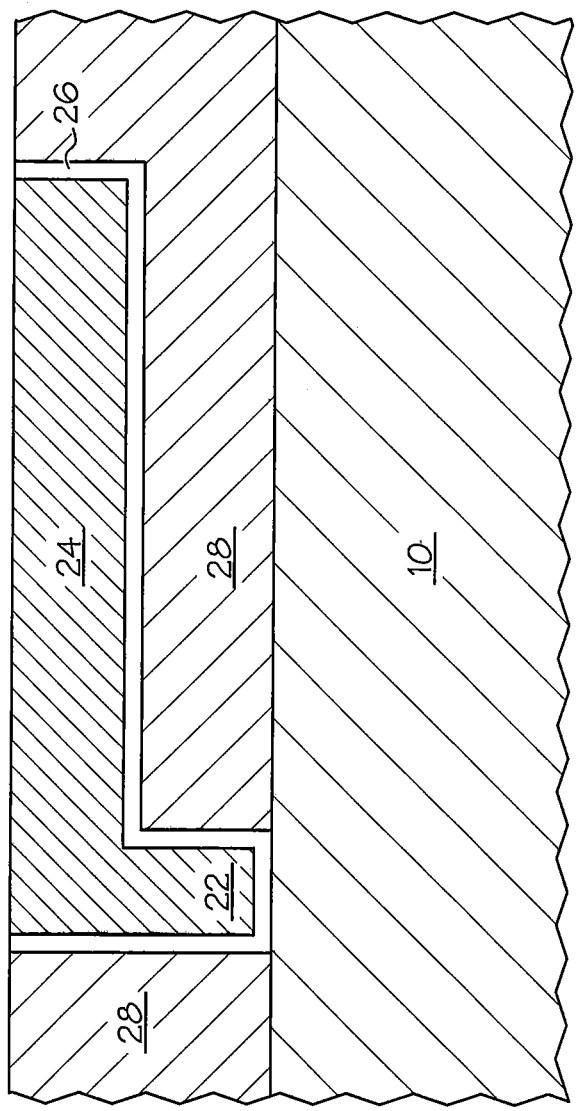

Then, referring to FIG. 10C, a unitary metal via 22 and first conductive line 24 are formed on the first barrier layer 26 that lines the bottom surface and sidewall of the via V and the bottom surface and sidewall of the first trench T1. The unitary metal via 22 and first conductive line 24 may be fabricated by depositing a seed copper layer on the barrier layer 26, depositing a copper layer using electrolytic plating, and chemical-mechanical polishing to planarize the first conductive line 24.

Figure 10D:
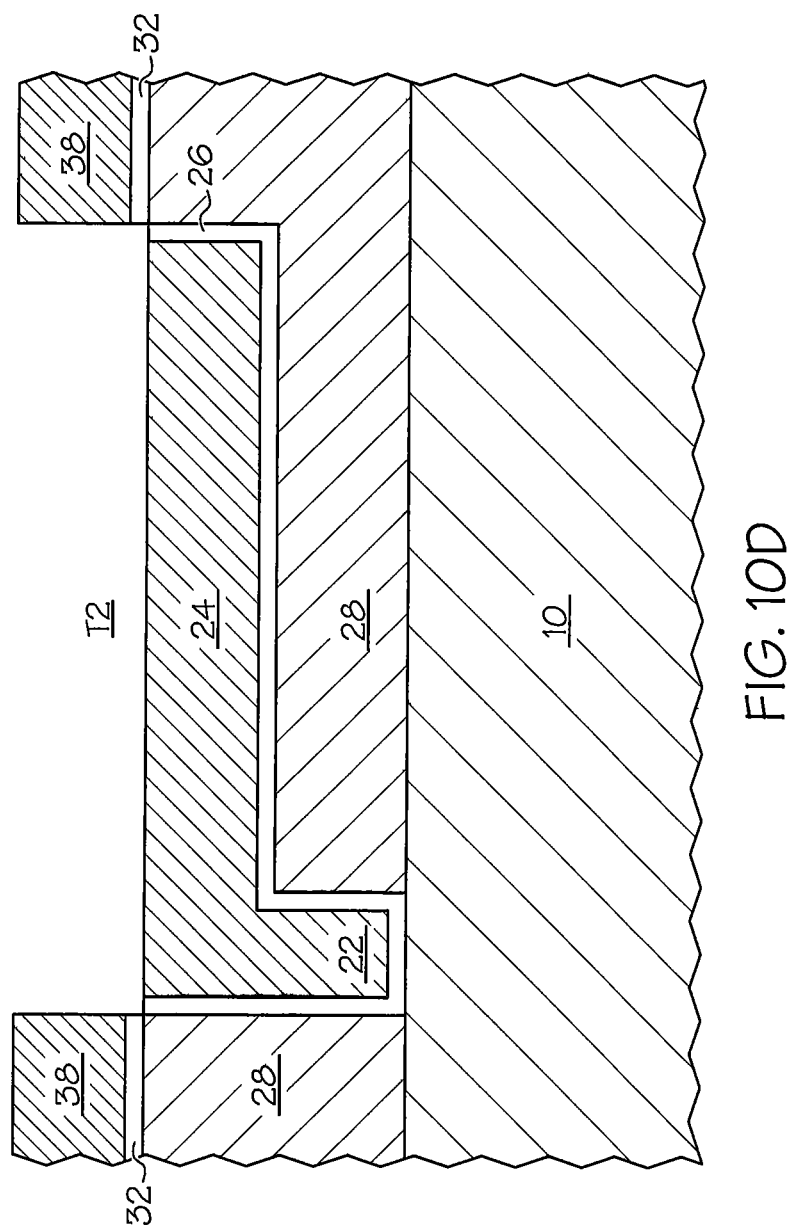

Referring now to FIG. 10D, a capping layer 32 is formed and patterned, and a second dielectric layer 38 is formed and patterned. It will be understood that the capping layer 32 and the second intermetal dielectric layer 38 may both be blanket deposited and then patterned using the same reticle or mask. Moreover, the reticle or mask that is used to pattern the capping layer 32 and the second intermetal dielectric layer 38 may be the same as that which was used to pattern the first trench T1 in FIG. 10A. Thus, FIG. 10D illustrates etching a second trench T2 in a second dielectric layer 38 that is on the first dielectric layer 28, wherein the second trench T2 exposes at least a portion of a top surface of the first conductive line 24. In some embodiments, the entire top surface of the first conductive line 24 is exposed.

Referring to FIG. 10E, the exposed portion of the top surface of the first conductive line 24, and in some embodiments the entire top surface of the first conductive line 24, and a sidewall of the second trench T2, are lined with a second barrier layer 36.

Referring to FIG. 10F, a second conductive line 34 is then formed on the second barrier layer 36 that lines the at least a portion of the top surface of the first conductive line 24 and a sidewall of the second trench T2. The second conductive line 34 may be formed by a seed layer deposition followed by electrolytic plating of copper and chemical-mechanical polishing to planarize the second conductive line 34. A second capping layer 42 may then be added as was illustrated in FIG. 6. It will also be understood that the operations of FIGS. 10D, 10E and 10F may be repeated to form a plurality of stacked single-damascene lines as was illustrated, for example, in FIG. 9.

FIGS. 11A-11F are cross-sectional views illustrating the fabrication of a microelectronic device according to various other embodiments described herein. The operations of FIGS. 11A-11F may form microelectronic devices as illustrated, for example, in FIG. 7.

Figure 11A:
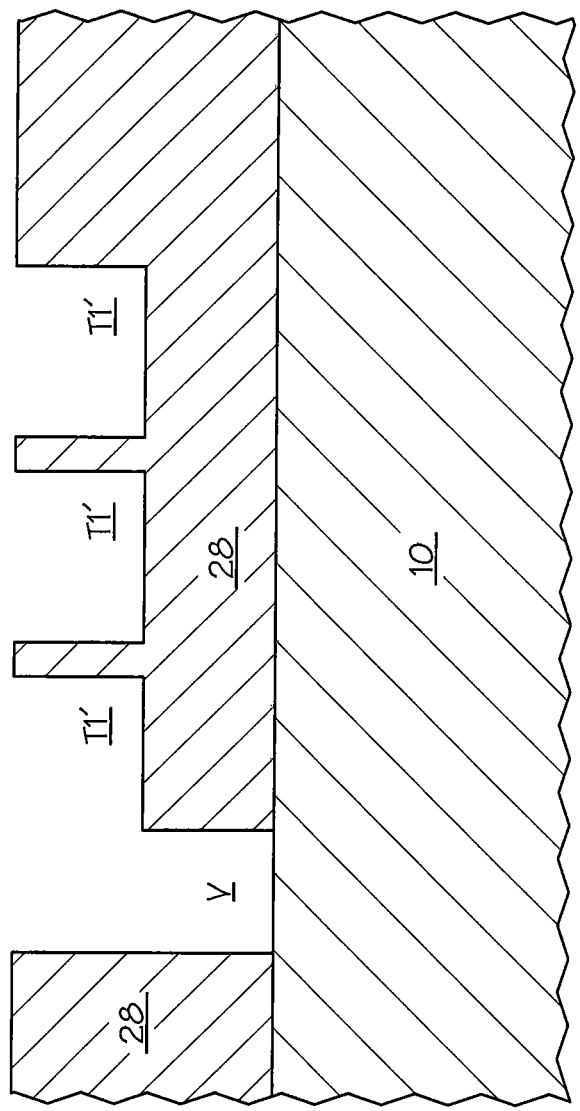
FIGS. 11A-11F are cross-sectional views illustrating methods of fabricating microelectronic devices and devices so fabricated according to various other embodiments described herein.

As illustrated in FIG. 11A, a via V and a plurality of first trenches T1' are etched in a first dielectric layer 28 on a microelectronic substrate 10. At least one of the first trenches T1' is connected to the via V. The first trenches T1' may all have a length that is less than a critical length, as was described above.

Figure 11B:
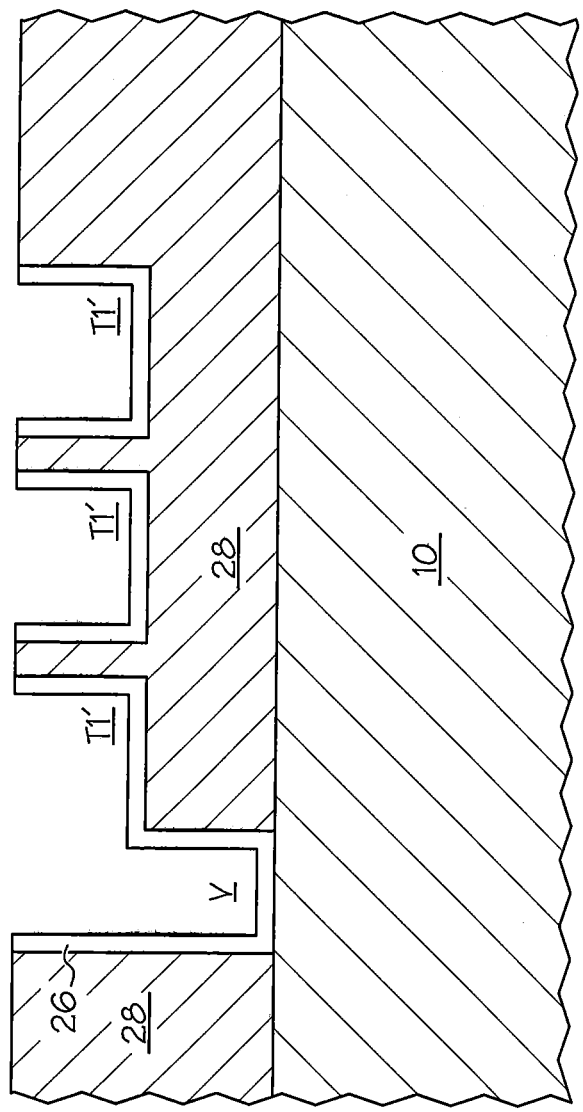

Referring to FIG. 11B, a first barrier layer 26 is then formed on the floor and sidewall of the via V, and on the floor and sidewalls of the first trenches T1'.

Figure 11C:
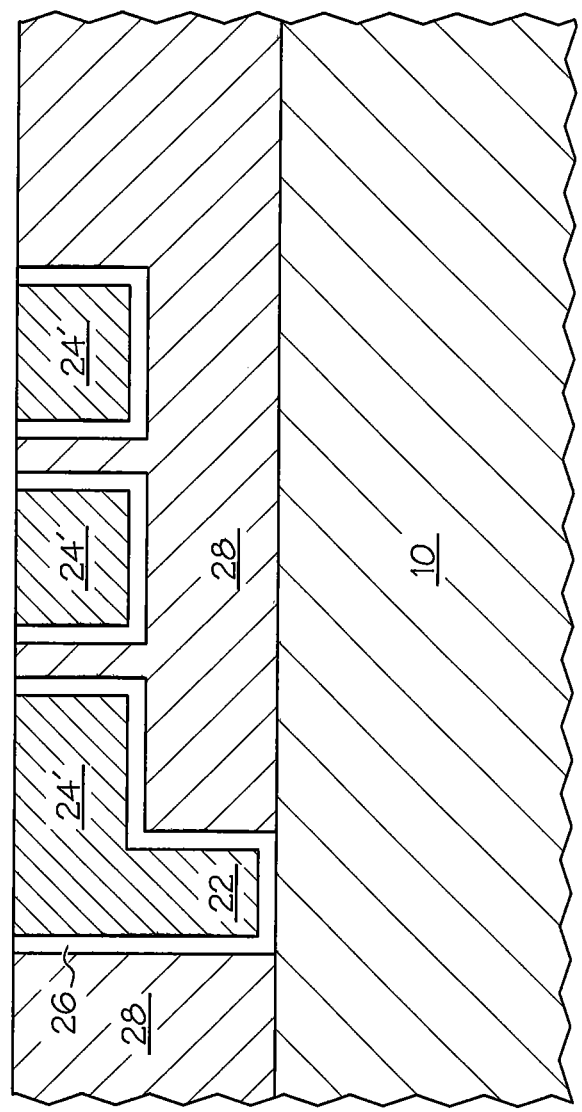

Referring to FIG. 11C, a unitary metal via 22 and a plurality of first conductive line segments 24' are formed on the first barrier layer 26. It will be understood that in these embodiments, only one of the first conductive line segments 24' may form a unitary structure with the metal via 22.

Figure 11D:
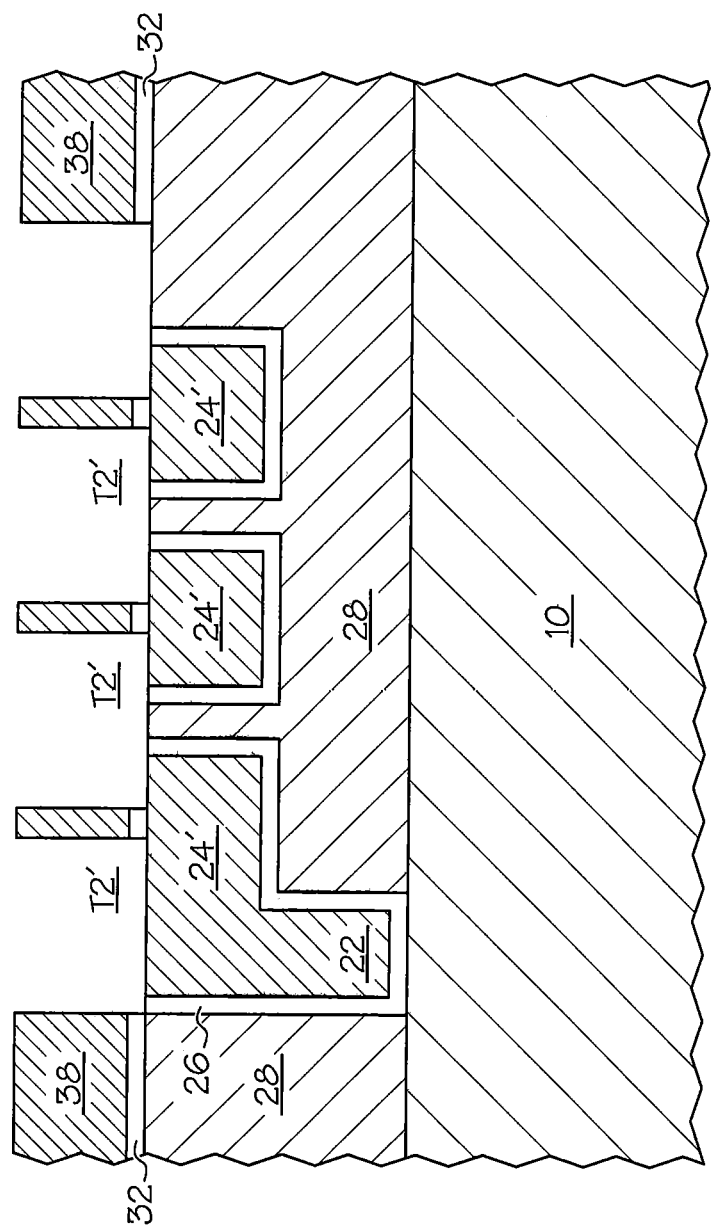

Referring to FIG. 11D, a plurality of second trenches T2' are etched in a second dielectric layer 38 that is on the first dielectric layer 28. The second trenches T2' expose at least a portion of top surfaces of the first conductive line segments 24'. It will be understood that the second trenches T2' are offset from the first trenches T1' of FIG. 11B. Thus, the plurality of second trenches T2' may be etched using a different reticle or mask than was used to etch a plurality of first trenches T1'. In other embodiments, the same reticle or mask may be used, with a lateral offset applied.

Figure 11E:
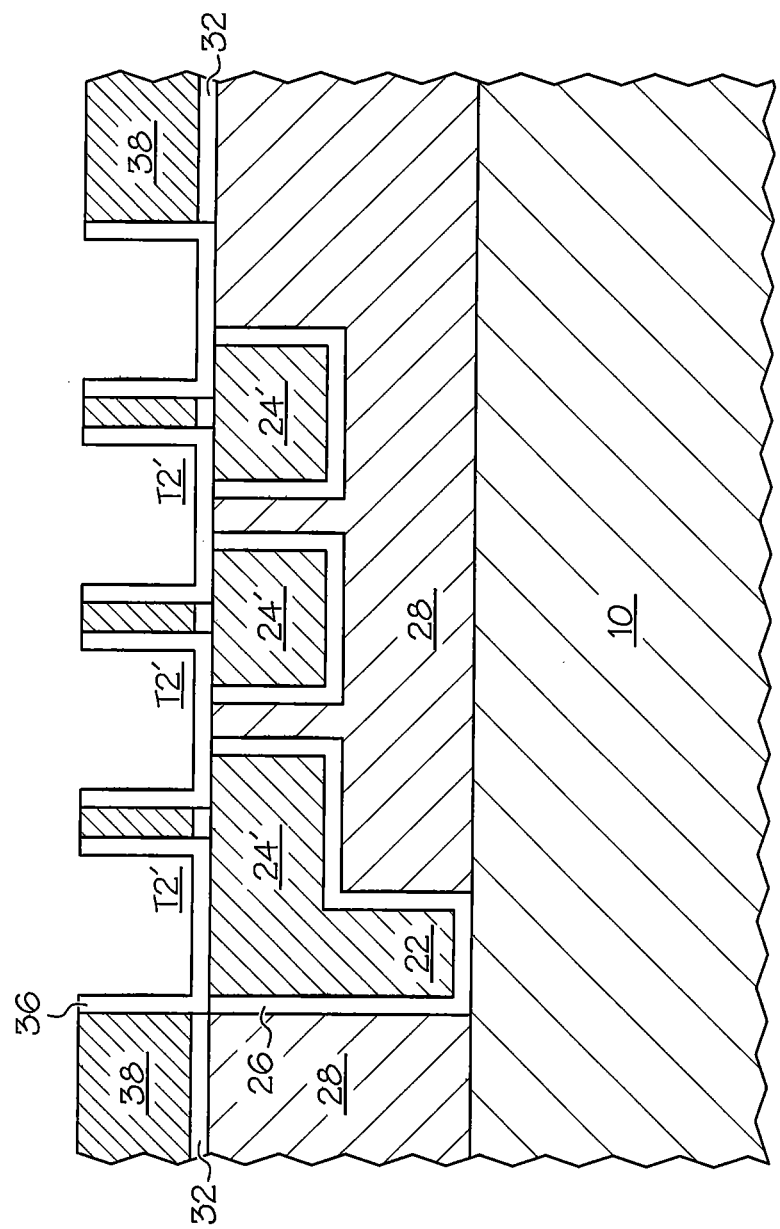

Referring to FIG. 11E, bottom surfaces and sidewalls of the plurality of second trenches T2' are lined with a second barrier layer 36.

Figure 11F:
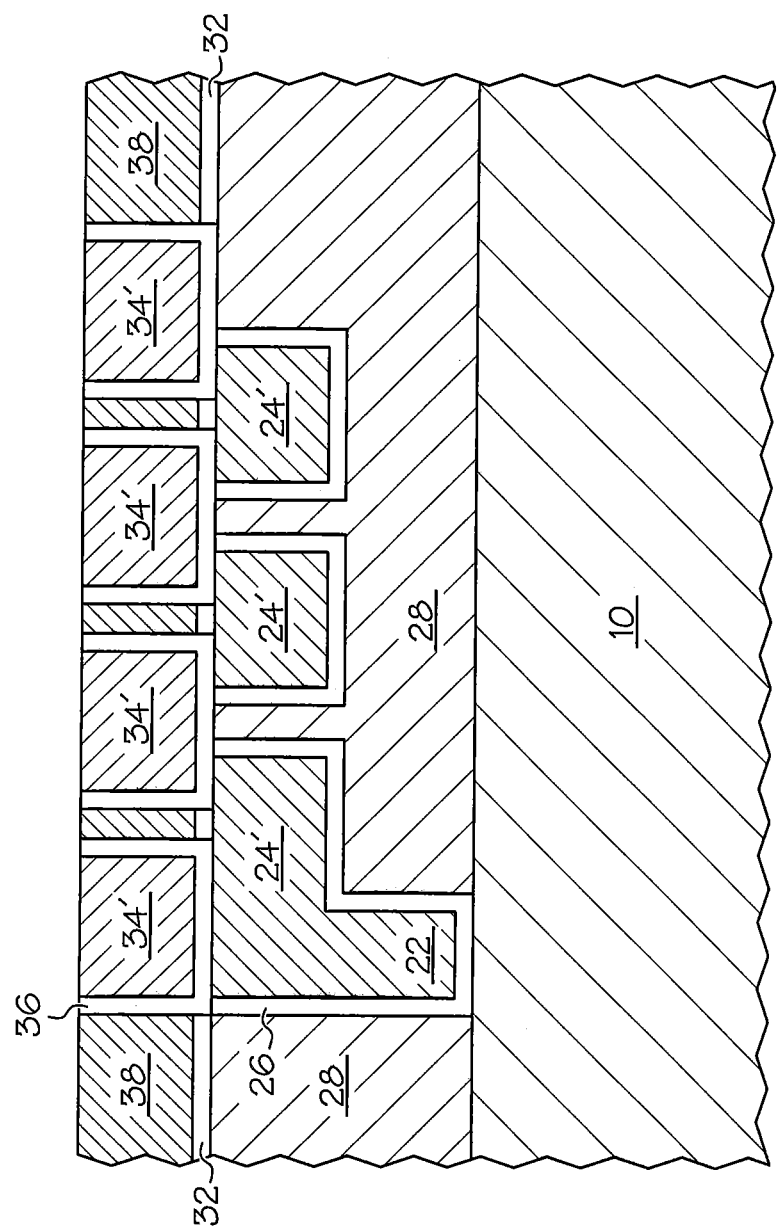

Referring to FIG. 11F, a plurality of second conductive line segments 34' are formed on the second barrier layer 36 that lines the bottom surfaces and the sidewalls of the second trenches T2'. Additional processing may be performed to obtain the structure of FIG. 7.

Figure 12:
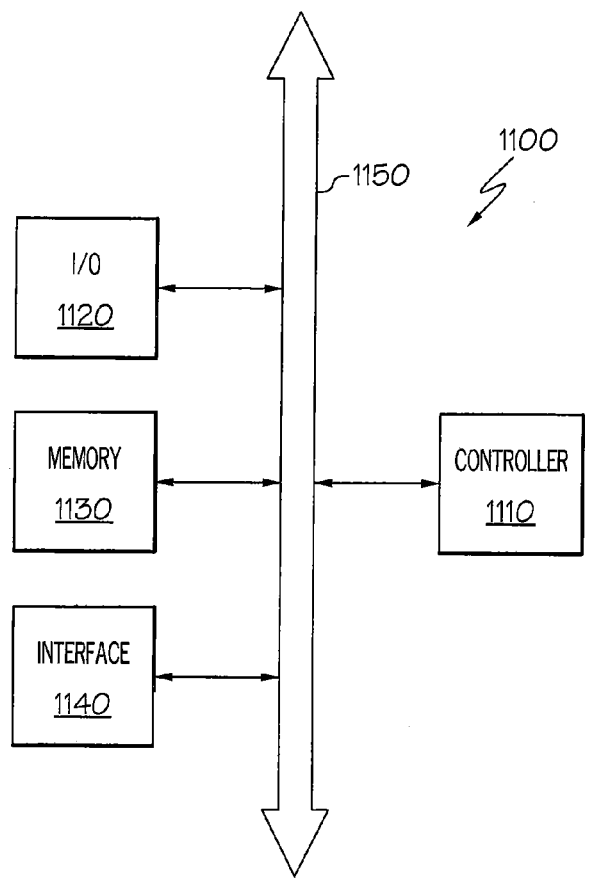
FIG. 12 is a schematic block diagram of a system including a microelectronic device according to various embodiments described herein.

FIG. 12 is a schematic block diagram of a system including a microelectronic device according to various embodiments described herein.

Referring to FIG. 12, the system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path over which data can be moved between system elements.

The controller 1110 may comprise a microprocessor, a digital signal processor, a microcontroller and/or a similar device that can control an operating program. The input/output device 1120 may comprise a keypad, a keyboard, or a display. The memory device 1130 may not only save code or data for executing the controller 1110 but also save data executed by the controller 1110. The memory device 1130 and/or other blocks of FIG. 12 may comprise a microelectronic device, according to any of the embodiments described herein.

The system 1100 may be applied to a product that can transport information, e.g., a PDA (personal digital assistant), a portable computer, a web tablet, a wireless phone, a mobile phone, a digital music player and/or a memory card.

Figure 13:
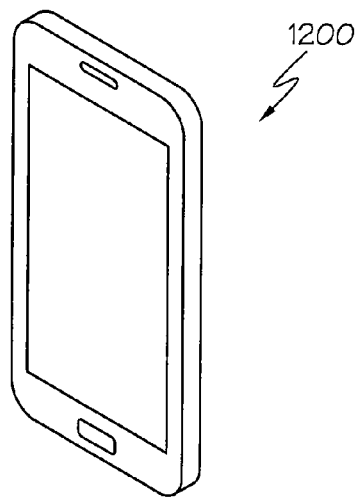
FIG. 13 is a perspective view illustrating a mobile phone that may include the system of FIG. 12.

The system 1100 of FIG. 12 may be applied to other various products. FIG. 13 is a perspective view illustrating a mobile phone 1200 including the system 1100 of FIG. 12. In addition, the system 1100 of FIG. 13 may be applied to a portable notebook, a MP3 player, navigation system, a solid state disk (SSD), a car and/or a household appliance.

Embodiments of the inventive concepts have been described above with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout the drawings and specification. As used herein the expression "and/or" includes any and all combinations of one or more of the associated listed items.

The previous description was presented to enable one of ordinary skill in the art to make and use the inventive concepts and is provided in the context of a patent application and its requirements. Various modifications to the embodiments and the generic principles and features described herein will be readily apparent. The embodiments are mainly described in terms of particular methods and devices provided in particular implementations. However, the methods and devices may operate effectively in other implementations. The embodiments have been described with respect to devices having certain elements. However, the devices may include fewer or additional elements than those shown, and variations in the arrangement and type of the elements may be made without departing from the scope of the inventive concepts. The embodiments have also been described in the context of particular methods having certain steps or operations. However, the methods and devices may operate effectively for other methods having different and/or additional steps/operations and steps/operations in different orders that are not inconsistent with the embodiments. Thus, the present inventive concepts are not intended to be limited to the embodiments shown, but is to be accorded the widest scope consistent with the principles and features described herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concepts.

It will also be understood that when an element is referred to as being "coupled to" or "connected to" or "on" another element, it can be directly coupled to, connected to or on the other element or intervening elements may also be present. In contrast, when an element is referred to as being "directly coupled to" or "directly connected to" or "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures. It will also be understood that terms, such as "top", "bottom" and "sidewall" of an element, layer or region are described relative to an underlying substrate. Thus, a "bottom" of an element, layer or region is the surface of the element, layer or region that is closest to a substrate, a "top" of the element, layer or region is the surface of the element, layer or region that is furthest away from the substrate, and a "sidewall" is a surface that connects the top and bottom of the element, layer or region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

Embodiments of the inventive concepts have been described above with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All embodiments can be combined in any way and/or combination.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single via or line is illustrated in a cross-sectional view of a device/structure, the device/structure may include a plurality of vias, lines and other structures thereon, as would be illustrated by a plan view of the device.

In the drawings and specification, there have been disclosed typical embodiments of the inventive concepts and, although specific terms are employed, they are used in a generic and descriptive sense only and not for purposes of limitation, the scope of the inventive concepts being set forth in the following claims.

What is claimed is:

1. A microelectronic device comprising:
    a microelectronic substrate;
    a dual-damascene interconnect structure on the microelectronic substrate, the dual-damascene interconnect structure comprising a conductive via and a first conductive line directly on the conductive via opposite the microelectronic substrate; and
    a single-damascene line structure directly on the dual-damascene interconnect structure, the single-damascene line structure comprising a second conductive line on the first conductive line opposite the conductive via.

2. The microelectronic device of claim 1:
    wherein the dual-damascene interconnect structure further comprises a first barrier layer that extends on a bottom surface of the conductive via, on a sidewall of the conductive via, on a bottom surface of the first conductive line outside the conductive via and on a sidewall of the first conductive line, and
    wherein the single-damascene line structure further comprises a second barrier layer that extends between a top surface of the first conductive line and a bottom surface of the second conductive line and on a sidewall of the second conductive line.

3. The microelectronic device of claim 2 wherein the first barrier layer does not extend between the conductive via and the first conductive line.

4. The microelectronic device of claim 1:
    wherein the dual-damascene interconnect structure further comprises a first intermetal dielectric layer on the microelectronic substrate, wherein the first conductive line and the conductive via extend into the first intermetal dielectric layer, and
    wherein the single-damascene line structure further comprises:
        a second intermetal dielectric layer on the first intermetal dielectric layer opposite the substrate, wherein the second conductive line extends into the second intermetal dielectric layer; and
        a capping layer between the first and second intermetal dielectric layers.

5. The microelectronic device of claim 2:
    wherein the dual-damascene interconnect structure further comprises a first intermetal dielectric layer on the microelectronic substrate, wherein the first conductive line, the conductive via and the first barrier layer extend into the first intermetal dielectric layer, and
    wherein the single-damascene line structure further comprises:
        a second intermetal dielectric layer on the first intermetal dielectric layer opposite the substrate, wherein the second conductive line extends into the second intermetal dielectric layer; and
        a capping layer between the first and second intermetal dielectric layers, the capping layer being coplanar with a portion of the second barrier layer that extends between the top surface of the first conductive line and the bottom surface of the second conductive line and electrically connecting the first and second conductive lines.

6. The microelectronic device of claim 1 wherein a top surface of the first conductive line is congruent to a bottom surface of the second conductive line.

7. The microelectronic device of claim 1:
    wherein the first conductive line comprises a plurality of first conductive line segments including at least one first gap therebetween,
    wherein the second conductive line comprises a plurality of second conductive line segments including at least one second gap therebetween, and
    wherein the at least one first gap is laterally offset from the at least one second gap.

8. The microelectronic device of claim 7, wherein the first conductive line segments, the second conductive line segments and the first and second gaps are arranged in a brick wall pattern so as not to fail by electromigration effects.

9. The microelectronic device of claim 7:
    wherein the dual-damascene interconnect structure further comprises a first barrier layer that extends on a bottom surface of the conductive via, on a sidewall of the conductive via, on bottom surfaces of the first conductive line segments outside the conductive via and on sidewalls of the first conductive line segments, and
    wherein the single-damascene line structure further comprises a second barrier layer that extends between top surfaces of the first conductive line segments and bottom surfaces of the second conductive line segments and on sidewalls of the second conductive line segments.

10. The microelectronic device of claim 1 wherein the first and second conductive lines are sufficiently short so as to not fail by electromigration effects.

11. The microelectronic device of claim 1 wherein the single-damascene line structure is a first single-damascene line structure, the microelectronic device further comprising:
    a second single-damascene line structure directly on the first single-damascene line structure opposite the dual-damascene interconnect structure, the second single-damascene line structure comprising a third conductive line on the second conductive line opposite the first conductive line.

12. A microelectronic device comprising:
a microelectronic substrate;
a first conductive line on the microelectronic substrate, the first conductive line comprising a plurality of first conductive line segments including at least one first gap therebetween; and
a second conductive line directly on the first conductive line opposite the microelectronic substrate, the second conductive line comprising a plurality of second conductive line segments including at least one second gap therebetween;
wherein the at least one first gap is laterally offset from the at least one second gap.

13. The microelectronic device of claim 12 wherein the first and second conductive lines are damascene conductive lines.

14. The microelectronic device of claim 12 wherein each of the first and second conductive line segments is sufficiently short so as to not fail by electromigration effects.

15. The microelectronic device of claim 12:
wherein the first conductive line comprises a first barrier layer that extends on bottom surfaces of the first conductive line segments and on sidewalls of the first conductive line segments, and
wherein the second conductive line comprises a second barrier layer that extends on bottom surfaces of the second conductive line segments and on sidewalls of the second conductive line segments.

16. The microelectronic device of claim 12 further comprising:
a first intermetal dielectric layer on the microelectronic substrate, wherein the first conductive line segments extend into the first intermetal dielectric layer;
a second intermetal dielectric layer on the first intermetal dielectric layer opposite the substrate, wherein the second conductive line segments extend into the second intermetal dielectric layer; and
a capping layer between the first and second intermetal dielectric layers.

17. The microelectronic device of claim 15 further comprising:
a first intermetal dielectric layer on the microelectronic substrate, wherein the first conductive line segments extend into the first intermetal dielectric layer;
a second intermetal dielectric layer on the first intermetal dielectric layer opposite the substrate, wherein the second conductive line segments extend into the second intermetal dielectric layer; and
a capping layer between the first and second intermetal dielectric layers, the capping layer being coplanar with the second barrier layer that extends on bottom surfaces of the second conductive line segments and electrically connecting the first and second conductive lines.

18. A microelectronic device comprising:
a damascene structure; and
a single-damascene line structure directly on the damascene structure,
wherein the damascene structure and the single-damascene line structure each comprise a plurality of line segments that are arranged in a brick wall pattern.

19. The microelectronic device of claim 18 wherein the damascene structure comprises a dual-damascene interconnect structure or a single-damascene line structure.

* * * * *